United States Patent
Wang (10) Patent No.: US 9,812,512 B2
(45) Date of Patent: Nov. 7, 2017

(54) PIXEL STRUCTURE AND DISPLAY APPARATUS

(71) Applicant: BOE TECHNOLOGY GROUP CO., LTD., Beijing (CN)

(72) Inventor: Shang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 14/436,407

(22) PCT Filed: Nov. 13, 2014

(86) PCT No.: PCT/CN2014/091011
§ 371 (c)(1),
(2) Date: Apr. 16, 2015

(87) PCT Pub. No.: WO2015/169077
PCT Pub. Date: Nov. 12, 2015

(65) Prior Publication Data
US 2016/0293678 A1    Oct. 6, 2016

(30) Foreign Application Priority Data
May 8, 2014 (CN) .......................... 2014 1 0193163

(51) Int. Cl.
*H01L 27/00* (2006.01)
*H01L 27/32* (2006.01)
*H01L 27/12* (2006.01)

(52) U.S. Cl.
CPC .......... *H01L 27/3216* (2013.01); *H01L 27/12* (2013.01); *H01L 27/3218* (2013.01)

(58) Field of Classification Search
CPC .................. H01L 27/3216; H01L 27/3218
See application file for complete search history.

(56) References Cited

U.S. PATENT DOCUMENTS 8,314,866 B2 * 11/2012 Massetti ........... H01L 27/14621
348/275
9,231,033 B2 * 1/2016 Ahn .................... H01L 27/3218
(Continued)

FOREIGN PATENT DOCUMENTS

| CN | 1870277 A | 11/2006 |
|---|---|---|
| CN | 2899006 Y | 5/2007 |
| CN | 103985738 A | 8/2014 |

OTHER PUBLICATIONS

International Search Report and Written Opinion dated Feb. 11, 2015 regarding PCT/CN2014/091011. Translation provided by Dragon Intellectual Property Law Firm.
(Continued)

*Primary Examiner* — Kimberly Rizkallah
*Assistant Examiner* — Alexander Belousov
(74) *Attorney, Agent, or Firm* — Harness, Dickey & Pierce, P.L.C.

(57) ABSTRACT

The pixel structure includes a plurality of pixel units each including a first sub-pixel with a first color, having a first adjoining edge of a first length and a second adjoining edge of a second length; a second sub-pixel with a second color, having a first adjoining edge of the first length and a second adjoining edge of a third length; and a third sub-pixel with a third color, having a first adjoining edge of the second length and a second adjoining edge of the third length. In each pixel unit, the first adjoining edge of the first sub-pixel is adjoined to the first adjoining edge of the second sub-pixel, the second adjoining edge of the first sub-pixel is adjoined to the first adjoining edge of the third sub-pixel, and the second adjoining edge of the second sub-pixel is adjoined to the second adjoining edge of the third sub-pixel.

9 Claims, 5 Drawing Sheets

(56) References Cited

U.S. PATENT DOCUMENTS

2009/0278131 A1   11/2009  Kwon et al.
2009/0302331 A1*  12/2009  Smith ................ H01L 27/3211
                                                          257/88
2015/0021637 A1*   1/2015  Ahn .................... H01L 27/3218
                                                          257/89

OTHER PUBLICATIONS

Chinese Office Action dated Feb. 10, 2015 regarding Chinese Application No. 201410193163.6 Translation provided by Dragon Intellectual Property Law Firm.

\* cited by examiner

-Prior Art-

Fig. 1A

-Prior Art-

PIXEL STRUCTURE AND DISPLAY APPARATUS

CROSS REFERENCE OF RELATED APPLICATION

The present application is the U.S. national phase of PCT Application No. PCT/CN2014/091011 filed on Nov. 13, 2014, which claims the priority of Chinese patent application No. 201410193163.6 filed on May 8, 2014, the disclosure of which is incorporated herein by reference.

TECHNICAL FIELD

The present disclosure relates to the field of displaying technology, and more particular to a pixel structure and a display apparatus.

BACKGROUND

An organic light-emitting diode (OLED) is also called organic electroluminesence display (OELD). The OLED has a characteristic of self-luminescent, and includes a very thin coating of organic material and a glass substrate. When activated by power, the organic material may radiate. Moreover, the OLED display screen is wide in viewing angle, may be implemented as being flexible, and is significant in saving power. Thus, the OLED display has many advantages over the liquid crystal display (LCD).

Figure 1A:
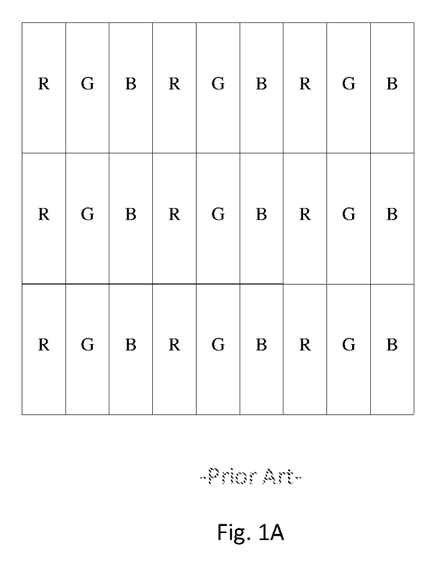
FIG. 1A is a schematic view of a traditional rectangular pixel structure with parallel arrangement for an OLED display screen.
Figure 1B:
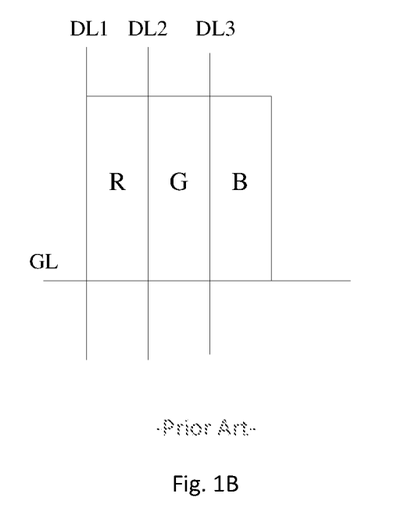
FIG. 1B is a schematic view of an array layout of a pixel unit included in the rectangular pixel structure.

As illustrated in FIG. 1A, a traditional rectangular pixel structure with parallel arrangement is applied in the conventional OLED display screen. Each pixel unit includes a rectangular red sub-pixel R, a rectangular green sub-pixel G and a rectangular blue sub-pixel B which are arranged in turns from left to right. There is an adjoining edge between the red sub-pixel R and the green sub-pixel G, and there is an adjoining edge between the green sub-pixel G and the blue sub-pixel B. However, the red sub-pixel R and the blue sub-pixel B are not adjoined to each other. As a result, light mixing effectiveness of the sub-pixels in each pixel unit of the traditional rectangular pixel structure with parallel arrangement is not satisfied, which causes the image quality of the OLED display screen being poor. FIG. 1B is a schematic view of an array layout of a pixel unit included in the rectangular pixel structure. GL indicates a gate line which provides scanning signals for the red sub-pixel R, the green sub-pixel G and the blue sub-pixel B; DL1 indicates a first data line for providing data to the red sub-pixel R; DL2 indicates a second data line for providing data to the green sub-pixel G; and DL3 indicates a third data line for providing data to the blue sub-pixel B.

SUMMARY

An object of the present disclosure is to provide a pixel structure and a display apparatus for improving light mixing effectiveness of sub-pixels in each pixel unit included in the pixel structure, so as to improve the image quality on the display screen.

For achieving such object, the present disclosure provides a pixel structure including a plurality of pixel units, and each of the pixel units includes:

a first sub-pixel with a first color, having a first adjoining edge of a first length and a second adjoining edge of a second length;

a second sub-pixel with a second color, having a first adjoining edge of the first length and a second adjoining edge of a third length; and a third sub-pixel with a third color, having a first adjoining edge of the second length and a second adjoining edge of the third length;

in each of the pixel units, the first adjoining edge of the first sub-pixel is arranged to be adjoined to the first adjoining edge of the second sub-pixel, the second adjoining edge of the first sub-pixel is arranged to be adjoined to the first adjoining edge of the third sub-pixel, and the second adjoining edge of the second sub-pixel is arranged to be adjoined to the second adjoining edge of the third sub-pixel.

In the implementation, adjoining edges of at least one sub-pixel included in each pixel unit are partially or totally adjoined to adjoining edges of at least four sub-pixels with colors different from the color of the at least one sub-pixel.

In the implementation, the first sub-pixel is a green sub-pixel, the second sub-pixel is a red sub-pixel, and the third sub-pixel is a blue sub-pixel; and an area of the first sub-pixel is less than either of an area of the second sub-pixel and an area of the third sub-pixel.

In the implementation, a ratio of the area of the second sub-pixel and the area of the first sub-pixel is 1.4 to 1.6; and a ratio of the area of the third sub-pixel and the area of the first sub-pixel is 1.4 to 1.6.

In the implementation, the first sub-pixel has a square shape; and the pixel unit has a square shape;

each of the second sub-pixel and the third sub-pixel has a right-angled trapezoid shape; a size of the second sub-pixel is equal to a size of the third sub-pixel;

the first adjoining edge of the second sub-pixel is an upper base of the second sub-pixel, and the second adjoining edge of the second sub-pixel is a hypotenuse of the second sub-pixel;

the first adjoining edge of the third sub-pixel is an upper base of the third sub-pixel, and the second adjoining edge of the third sub-pixel is a hypotenuse of the third sub-pixel; and a ratio of the area of the first sub-pixel, the area of the second sub-pixel and the area of the third sub-pixel is 1:1.5:1.5.

In the implementation, the first sub-pixel has a square shape; each of the second sub-pixel and the third sub-pixel is of a pentagon with three right angles; and a size of the second sub-pixel is equal to a size of the third sub-pixel;

a first edge of the second sub-pixel is the first adjoining edge of the second sub-pixel, a second edge of the second sub-pixel is the second adjoining edge of the second sub-pixel, a first end of the first edge is connected to a first end of the second edge, and an intersection angle between the first edge and the second edge is 135°; a first end of a third edge of the second sub-pixel is connected to a second end of the second edge, and an intersection angle between the third edge and the second edge is 135°; a first end of a fourth edge of the second sub-pixel is connected to a second end of the first edge, and a length of the fourth edge is equal to a length of the first edge;

a first edge of the third sub-pixel is the first adjoining edge of the third sub-pixel, a second edge of the third sub-pixel is the second adjoining edge of the third sub-pixel, a first end of the first edge is connected to a first end of the second edge, and an intersection angle between the first edge and the second edge is 135°; a first end of a third edge of the third sub-pixel is connected to a second end of the second edge, and an intersection angle between the third edge and the second edge is 135°; a first end of a fourth edge of the third sub-pixel is connected to a second end of the first edge, and a length of the fourth edge is equal to a length of the first edge.

In the implementation, the first sub-pixel has a square shape; each of the second sub-pixel and the third sub-pixel is of a pentagon with three right angles; a size of the second sub-pixel is equal to a size of the third sub-pixel; and the first length, the second length and the third length are equal;

a first edge of the second sub-pixel is the first adjoining edge of the second sub-pixel, a second edge of the second sub-pixel is the second adjoining edge of the second sub-pixel, a first end of the first edge is connected to a first end of the second edge, and an intersection angle between the first edge and the second edge is 135°;

a first edge of the third sub-pixel is the first adjoining edge of the third sub-pixel, a second edge of the third sub-pixel is the second adjoining edge of the third sub-pixel, a first end of the first edge is connected to a first end of the second edge, and an intersection angle between the first edge and the second edge is 135°; and the pixel unit is of a triangle with two angles being chamfered.

In the implementation, a ratio of the area of the first sub-pixel, the area of the second sub-pixel and the area of the third sub-pixel is 1:1.4:1.4.

The present disclosure further provides a display apparatus including the above pixel structure.

Comparing with the conventional techniques, in the pixel unit of the pixel structure and the display apparatus according to the present disclosure, the light mixing effectiveness of the sub-pixels in each pixel unit is improved by providing adjoining edges between every two sub-pixels, thereby improving the image quality on the display screen.

DETAILED DESCRIPTION

A pixel structure provided in one embodiment of the present disclosure includes a plurality of pixel units. Each of the pixel units includes:

a first sub-pixel with a first color, having a first adjoining edge of a first length and a second adjoining edge of a second length;

a second sub-pixel with a second color, having a first adjoining edge of the first length and a second adjoining edge of a third length; and a third sub-pixel with a third color, having a first adjoining edge of the second length and a second adjoining edge of the third length;

in each of the pixel units, the first adjoining edge of the first sub-pixel is arranged to be adjoined to the first adjoining edge of the second sub-pixel, the second adjoining edge of the first sub-pixel is arranged to be adjoined to the first adjoining edge of the third sub-pixel, and the second adjoining edge of the second sub-pixel is arranged to be adjoined to the second adjoining edge of the third sub-pixel.

Comparing with the conventional rectangular pixel structure with parallel arrangement, in the pixel unit of the pixel structure according to one embodiment of the present disclosure, there are adjoining edges between every two sub-pixels, thereby improving the light mixing effectiveness of the sub-pixels in each pixel unit and improving the image quality on the display screen.

Alternatively, in the pixel structure of one embodiment of the present disclosure, adjoining edges of at least one sub-pixel included in each pixel unit are totally or partially adjoined to adjoining edges of at least four sub-pixels with colors different from the color of the at least one sub-pixel. Comparing with that the adjoining edges of each sub-pixel are merely adjoined to adjoining edges of two sub-pixels with colors different from the color of the each sub-pixel in the conventional rectangular pixel structure with parallel arrangement, in the pixel structure according to one embodiment of the present disclosure, the light mixing effectiveness of the sub-pixels in the whole pixel structure is improved, thereby further improving the image quality on the display screen.

Specifically, the pixel structure of one embodiment of the present disclosure may be provided in the OLED display apparatus. The first sub-pixel is a green sub-pixel G, the second sub-pixel is a red sub-pixel R, and the third sub-pixel is a blue sub-pixel B.

An area of the green sub-pixel G is less than either of an area of the red sub-pixel R and an area of the blue sub-pixel B.

In the conventional OLED display apparatus, the luminous efficiency of the blue sub-pixel is low, the luminous flux attenuation of the red sub-pixel R is severe, and the luminous efficiency of the green sub-pixel is high, so that the human eyes are more sensitive to the green sub-pixel. However, both of the area of the blue sub-pixel and the area of the red sub-pixel are equal to the area of the green sub-pixel in the conventional pixel structure, and therefore the color shift may only be corrected by tuning the signal contrast. However, such signal compensation is subject to serious limitations. Meanwhile, the brightness of the red light is also required to be compensated because the luminous flux attenuation of the red sub-pixel is severe; and the luminous efficiency of the green sub-pixel is high, so that the human eyes are more sensitive to the green sub-pixel. Regarding the above problems, in the pixel structure of one embodiment of the present disclosure, each of the area of the red sub-pixel and the area of the blue sub-pixel is adjusted to be greater than the area of the green sub-pixel. By increasing a proportion of the area of the red sub-pixel and a proportion of the area of the blue sub-pixel, the color shift may be corrected in a simple and direct manner, and an adjustable range for adjusting the color shift by adjusting the signal is also increased.

Alternatively, a ratio of the area of the red sub-pixel and the area of the green sub-pixel is 1.4 to 1.6; and a ratio of the area of the blue sub-pixel and the area of the green sub-pixel is 1.4 to 1.6. With such ratios of the areas, the OLED display apparatus may have a better effect of correcting the color shift.

The pixel structure of the present disclosure is further explained hereinafter with three embodiments.

First Embodiment

Figure 2A:
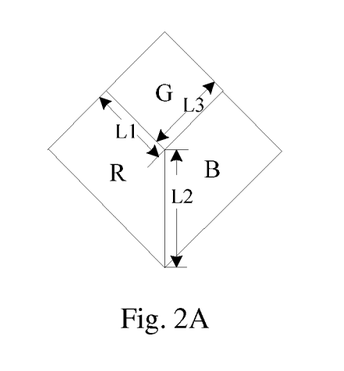
FIG. 2A is a schematic view of a pixel unit included in a pixel structure according to a first embodiment of the present disclosure.

As illustrated in FIG. 2A, the pixel unit includes a red sub-pixel R, a green sub-pixel G and a blue sub-pixel B.

The green sub-pixel G has a square shape.

Each of the red sub-pixel R and the blue sub-pixel B has a right-angled trapezoid shape; a size of the red sub-pixel R is equal to a size of the blue sub-pixel B.

A first adjoining edge of the red sub-pixel R is an upper base of the red sub-pixel R, and a second adjoining edge of the red sub-pixel R is a hypotenuse of the red sub-pixel R.

A first adjoining edge of the blue sub-pixel B is an upper base of the blue sub-pixel B, and a second adjoining edge of the blue sub-pixel B is a hypotenuse of the blue sub-pixel B.

The pixel unit composed of the red sub-pixel R, the green sub-pixel G and the blue sub-pixel B has a square shape.

A ratio of the area of the green sub-pixel G, the area of the red sub-pixel R and the area of the blue sub-pixel B is 1:1.5:1.5.

In the practical implementation, the ratio of the area of the green sub-pixel G, the area of the red sub-pixel R and the area of the blue sub-pixel B may also be set to 1:1.6:1.6. With such ratio, the color shift may also be better corrected based on the luminous flux attenuation of the conventional red sub-pixel R, the luminous efficiency of the conventional blue sub-pixel B and the luminous efficiency of the conventional green sub-pixel G.

In the pixel unit as illustrated in FIG. 2A, a length of the adjoining edge between the green sub-pixel G and the red sub-pixel R is L1; a length of the adjoining edge between the green sub-pixel G and the blue sub-pixel B is L3; and a length of the adjoining edge between the red sub-pixel R and the blue sub-pixel B is L2. In the practical implementation, the sub-pixels are isolated by a black matrix. Thus, in this embodiment of the present disclosure, a length L of the black matrix in each pixel unit of the pixel structure is L1+L2+L3, which is less than a length of a black matrix in each pixel unit of the conventional rectangular pixel structure with parallel arrangement. As a result, in this embodiment of the present disclosure, an aperture ratio of the pixel unit of the pixel structure is greater than an aperture ratio of the pixel unit of the conventional rectangular pixel structure with parallel arrangement.

Photology simulations are implemented for both the pixel unit included in the pixel structure according to one embodiment of the present disclosure as shown in FIG. 2A and the conventional pixel unit as shown in FIG. 1, and the result is as follows.

Regarding the pixel unit included in the pixel structure according to one embodiment of the present disclosure, a length of an edge of the pixel unit is a, a width of a black matrix area among the sub-pixels is 0.04 a (the black matrix is opaque), a width of a border region is 0.02 a (light transmittance of the border region is 50%), the luminescence of other region is uniform, and an aperture ratio of the pixel unit is 67.48% according to the photology simulation.

Regarding the pixel unit included in the conventional pixel structure, a length of an edge of the pixel unit is a, a width of a black matrix area among the sub-pixels is 0.04 a (the black matrix is opaque), a width of a border region is 0.02 a (light transmittance of the border region is 50%), the luminescence of other region is uniform, and an aperture ratio of the pixel unit is 65.154% according to the photology simulation.

It can be seen from above that the aperture ratio of the pixel unit of the pixel structure according to one embodiment of the present disclosure is greater than the aperture ratio of the pixel unit of the conventional rectangular pixel structure with parallel arrangement.

Furthermore, comparing with the conventional rectangular pixel structure with parallel arrangement from which the human eyes may clearly recognize the regular arrangement of the sub-pixels, the arrangement of the sub-pixels in the pixel structure according to the embodiment shown in FIG. 2A has a higher randomness, thereby reducing the ability of the human eyes for recognizing the sub-pixels and improving the image quality on the display screen.

Furthermore, in the embodiment as illustrated in FIG. 2A, the shape of each sub-pixel is more similar to a square, and thus a main light-emitting region of the sub-pixel is larger than a main light-emitting region of the rectangular sub-pixel of the conventional pixel structure. Comparing with a regional center of the conventional rectangular sub-pixel, a regional center of the sub-pixel of the embodiment is further away from a border light-emitting area. As a result, the luminous efficiency is higher, and a light-emitting layer may be deposited more uniformly (during a process of manufacturing the light-emitting layer of the OLED, it is often unable to make each area of each sub-pixel emit light uniformly, a center area of the sub-pixel usually has good luminous effect and higher luminous efficiency, while the border region in the periphery usually has low luminous efficiency, and therefore the area of the main light-emitting region at center is increased, and an area of the border light-emitting region is decreased).

Figure 2B:
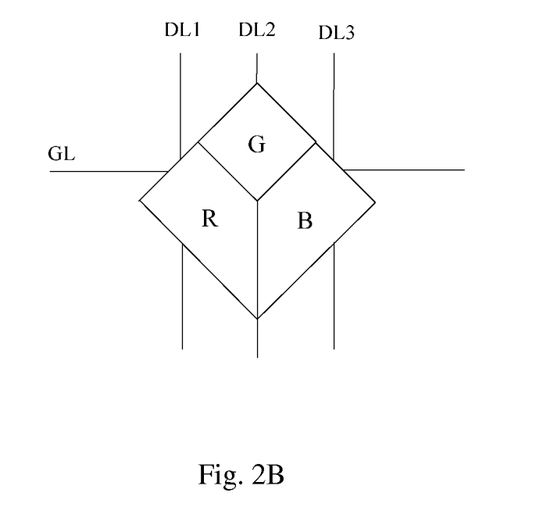
FIG. 2B is a schematic view of an array layout of the pixel unit included in the pixel structure according to the first embodiment of the present disclosure.

FIG. 2B is a schematic view of an array layout of the pixel unit included in the pixel structure according to this embodiment. As illustrated in FIG. 2B, the pixel structure according to this embodiment adopts an array layout similar to that of the conventional pixel structure, but a position of a gate line GL as illustrated in FIG. 2B is higher than that of the gate line (passing through a common region of the three sub-pixels). In FIG. 2B, the GL indicates a gate line which provides scanning signals for the red sub-pixel R, the green sub-pixel G and the blue sub-pixel B; the DL1 indicates a first data line for providing data to the red sub-pixel R; the DL2 indicates a second data line for providing data to the green sub-pixel G; and the DL3 indicates a third data line for providing data to the blue sub-pixel B.

Figure 2C:
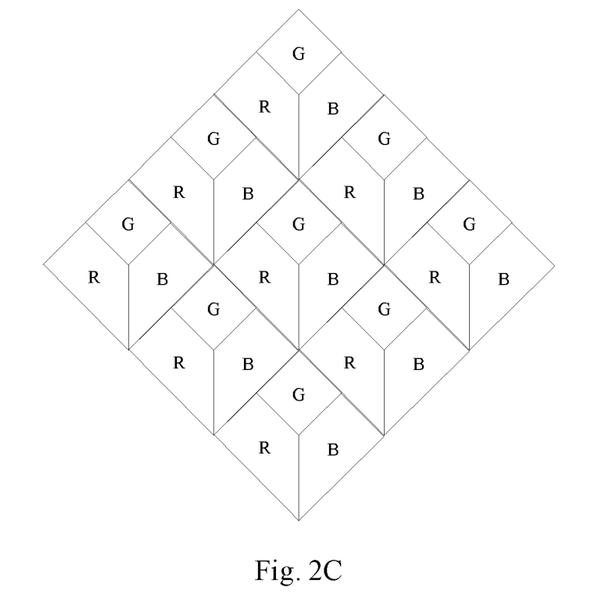
FIG. 2C is a schematic view of the pixel structure according to the first embodiment of the present disclosure.

FIG. 2C illustrates a pixel array composed of the pixel units as illustrated in FIG. 2A. In this pixel array, adjoining edges of at least one sub-pixel included in each pixel unit are totally or partially adjoined to adjoining edges of at least four sub-pixels with colors different from the color of the at least one sub-pixel. As a result, the light mixing effectiveness of the respective sub-pixels in the pixel array is improved, thereby further improving the image quality on the display screen.

Second Embodiment

Figure 3A:
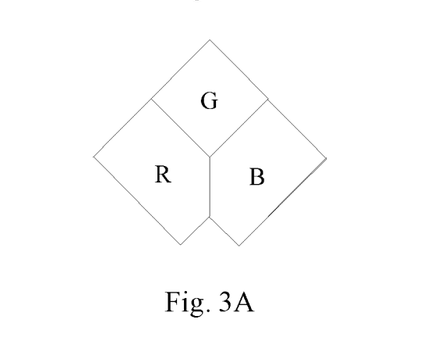
FIG. 3A is a schematic view of a pixel unit included in a pixel structure according to a second embodiment of the present disclosure.

As illustrated in FIG. 3A, the pixel unit includes a red sub-pixel R, a green sub-pixel G and a blue sub-pixel B.

The green sub-pixel G has a square shape; each of the red sub-pixel R and the blue sub-pixel B is of a pentagon with three right angles; the size of the red sub-pixel R is equal to the size of the blue sub-pixel B.

A first edge of the red sub-pixel R is a first adjoining edge of the red sub-pixel R, a second edge of the red sub-pixel R is a second adjoining edge of the red sub-pixel R, and a first end of the first edge is connected to a first end of the second edge, an intersection angle between the first edge and the second edge is 135°; a first end of a third edge of the red sub-pixel R is connected to a second end of the second edge, and an intersection angle between the third edge and the second edge is 135°; a first end of a fourth edge of the red sub-pixel R is connected to a second end of the first edge, and a length of the fourth edge is equal to a length of the first edge.

A first edge of the blue sub-pixel B is a first adjoining edge of the blue sub-pixel B, a second edge of the blue sub-pixel B is a second adjoining edge of the blue sub-pixel B, and a first end of the first edge is connected to a first end of the second edge, an intersection angle between the first edge and the second edge is 135°; a first end of a third edge of the blue sub-pixel B is connected to a second end of the second edge, and an intersection angle between the third edge and the second edge is 135°; a first end of a fourth edge of the blue sub-pixel B is connected to a second end of the first edge, and a length of the fourth edge is equal to a length of the first edge.

A ratio of the area of the green sub-pixel G, the area of the red sub-pixel R and the area of the blue sub-pixel B is 1:1.4:1.4.

The difference between the second embodiment and the first embodiment merely lies in removing tip structures having low luminous efficiency of the red sub-pixel R and the blue sub-pixel B, so that the luminous efficiency of the pixel unit as a whole is improved. Since the luminous efficiency of the blue sub-pixel B is low, the luminous flux attenuation of the red sub-pixel R is severe and the human eyes are more sensitive to the green sub-pixel G, thus, in consideration of the effect of correcting the color shift, the ratio of the area of the green sub-pixel G, the area of the red sub-pixel R and the area of the blue sub-pixel B is set to 1:1.4:1.4 in the second embodiment.

Figure 3B:
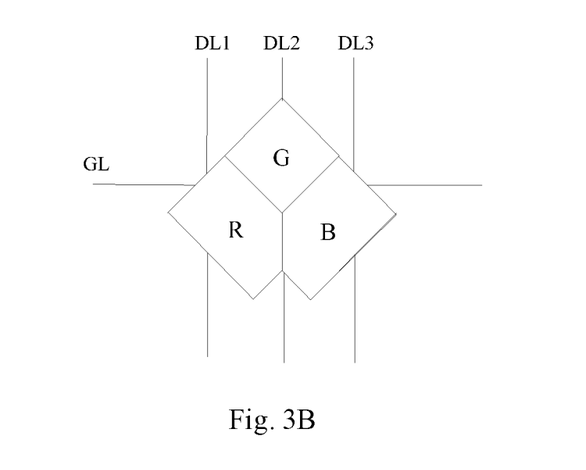
FIG. 3B is a schematic view of an array layout of the pixel unit included in the pixel structure according to the second embodiment of the present disclosure.

FIG. 3B is a schematic view of an array layout of the pixel unit included in the pixel structure according to the second embodiment. As illustrated in FIG. 3B, the pixel structure according to this embodiment adopts an array layout similar to that of the conventional pixel structure, but a position of the gate line GL as illustrated in FIG. 3B is higher than that of the conventional gate line (passing through a common region of the three sub-pixels). In FIG. 3B, the GL indicates a gate line which provides scanning signals for the red sub-pixel R, the green sub-pixel G and the blue sub-pixel B; the DL1 indicates a first data line for providing data to the red sub-pixel R; the DL2 indicates a second data line for providing data to the green sub-pixel G; and the DL3 indicates a third data line for providing data to the green sub-pixel B.

Figure 3C:
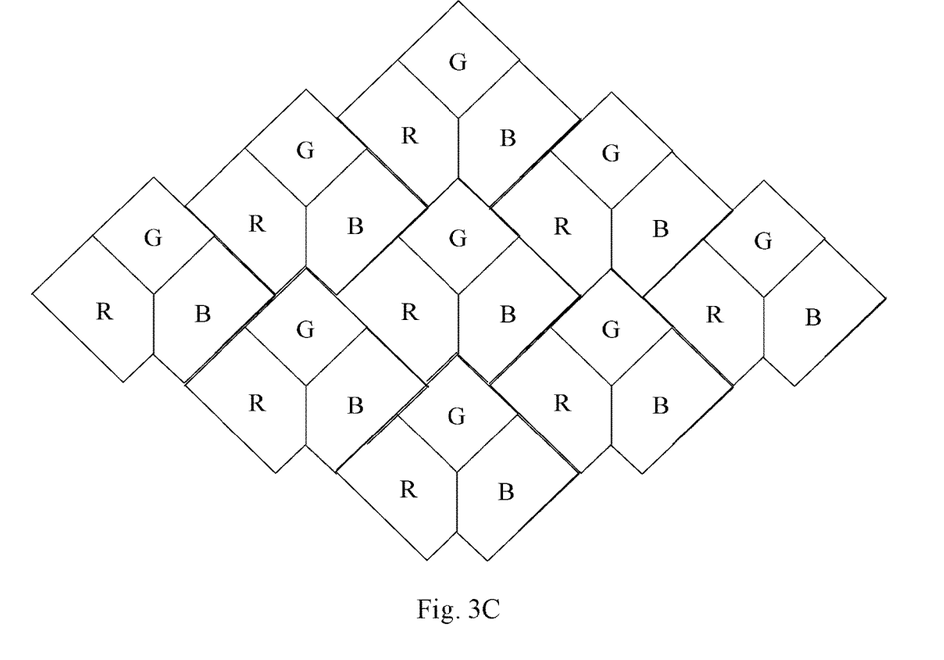
FIG. 3C is a schematic view of the pixel structure according to the second embodiment of the present disclosure.

FIG. 3C illustrates a pixel array composed of the pixel units as illustrated in FIG. 3A. In this pixel array, adjoining edges of at least one sub-pixel included in each pixel unit are totally or partially adjoined to adjoining edges of at least four sub-pixels with colors different from the color of the at least one sub-pixel. As a result, the light mixing effectiveness of the respective sub-pixels in the pixel array is improved, thereby further improving the image quality on the display screen.

In the practical implementation, the border region of the pixel display region in the display panel is filled with black matrices.

Third Embodiment

Figure 4A:
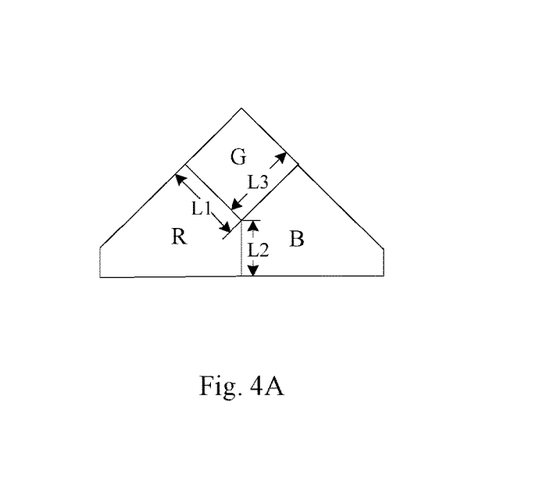
FIG. 4A is a schematic view of a pixel unit included in a pixel structure according to a third embodiment of the present disclosure.

As illustrated in FIG. 4A, the pixel unit includes a red sub-pixel R, a green sub-pixel G and a blue sub-pixel B.

The green sub-pixel G has a square shape; each of the red sub-pixel R and the blue sub-pixel B is of a pentagon with three right angles; the size of the red sub-pixel R is equal to the size of the blue sub-pixel B; the first length, the second length and the third length are equal.

A first edge of the red sub-pixel R is a first adjoining edge of the red sub-pixel R, a second edge of the red sub-pixel R is a second adjoining edge of the red sub-pixel R, and a first end of the first edge is connected to a first end of the second edge, and an intersection angle between the first edge and the second edge is 135°; a second end of the second edge is connected to a first end of the third edge of the red sub-pixel R, and an intersection angle between the third edge and the second edge is a right angle; a second end of the third edge is connected to a first end of the fourth edge of the red sub-pixel R, and an intersection angle between the fourth edge and the third edge is a right angle; a second end of the fourth edge is connected to a first end of a fifth edge of the red sub-pixel R, and an intersection angle between the fifth edge and the fourth edge is 135°.

A first edge of the blue sub-pixel B is a first adjoining edge of the blue sub-pixel B, a second edge of the blue sub-pixel B is a second adjoining edge of the blue sub-pixel B, and a first end of the first edge is connected to a first end of the second edge, and an intersection angle between the first edge and the second edge is 135°; a second end of the second edge is connected to a first end of a third edge of the blue sub-pixel B, and an intersection angle between the third edge and the second edge is a right angle; a second end of the third edge is connected to a first end of a fourth edge of the blue sub-pixel B, and an intersection angle of the fourth edge and the third edge is a right angle; a second end of the fourth edge is connected to a first end of a fifth edge of the blue sub-pixel B, and an intersection angle between the fifth edge and the fourth edge is 135°.

The pixel unit composed of the red sub-pixel R, the green sub-pixel G and the blue sub-pixel B is of a triangle with two angles being chamfered.

A ratio of the area of the green sub-pixel G, the area of the red sub-pixel R and the area of the blue sub-pixel B is 1:1.4:1.4.

In the pixel unit as illustrated in FIG. 4A, a length of the adjoining edge between the green sub-pixel G and the red sub-pixel R is L1; a length of the adjoining edge between the green sub-pixel G and the blue sub-pixel B is L3; and a length of the adjoining edge between the red sub-pixel R and the blue sub-pixel B is L2. In the practical implementation, the sub-pixels are isolated by a black matrix. Thus, in this embodiment of the present disclosure, a length L of the black matrix in each pixel unit of the pixel structure is L1+L2+L3, which is less than a length L of a black matrix in each pixel unit of the conventional rectangular pixel structure with parallel arrangement. As a result, in this embodiment of the present disclosure, an aperture ratio of the pixel unit of the pixel structure is greater than an aperture ratio of the pixel unit of the conventional rectangular pixel structure with parallel arrangement.

In the third embodiment, the shape of each sub-pixel is more similar to a square, and thus a main light-emitting region of the sub-pixel is larger than a main light-emitting region of the rectangular sub-pixel of the conventional pixel structure. Comparing with a regional center of the conventional rectangular sub-pixel, a regional center of the sub-pixel of the embodiment is further away from the border light-emitting region. As a result, the luminous efficiency is higher, and a light-emitting layer may be deposited more uniformly (during a process of manufacturing the light-emitting layer of the OLED, it is often unable to make each area of each sub-pixel emit light uniformly, a center area of the sub-pixel usually has good luminous effect and higher luminous efficiency, while the border region in the periphery usually has low luminous efficiency, and therefore the area of the main light-emitting region at center is increased, and an area of the border light-emitting region is decreased).

Figure 4B:
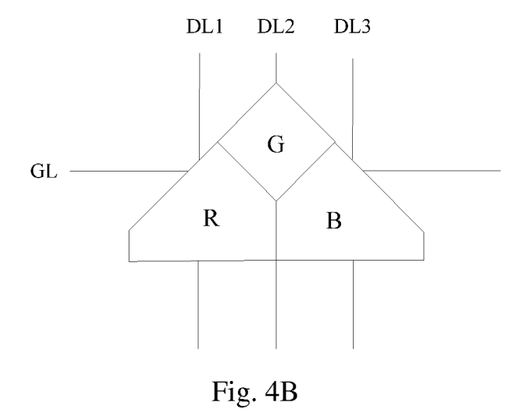
FIG. 4B is a schematic view of an array layout of the pixel unit included in the pixel structure according to the third embodiment of the present disclosure.

FIG. 4B is a schematic view of an array layout of the pixel unit included in the pixel structure according to the embodiment. As illustrated in FIG. 4B, the pixel structure according to this embodiment adopts an array layout similar to that of the conventional pixel structure, but a position of the gate line GL as illustrated in FIG. 4B is higher than that of the conventional gate line (passing through a common area of the three sub-pixels). In FIG. 4B, the GL indicates a gate line which provides scanning signals for the red sub-pixel R, the green sub-pixel G and the blue sub-pixel B; the DL1 indicates a first data line for providing data to the red sub-pixel R; the DL2 indicates a second data line for providing data to the green sub-pixel G; and the DL3 indicates a third data line for providing data to the green sub-pixel B.

Figure 4C:
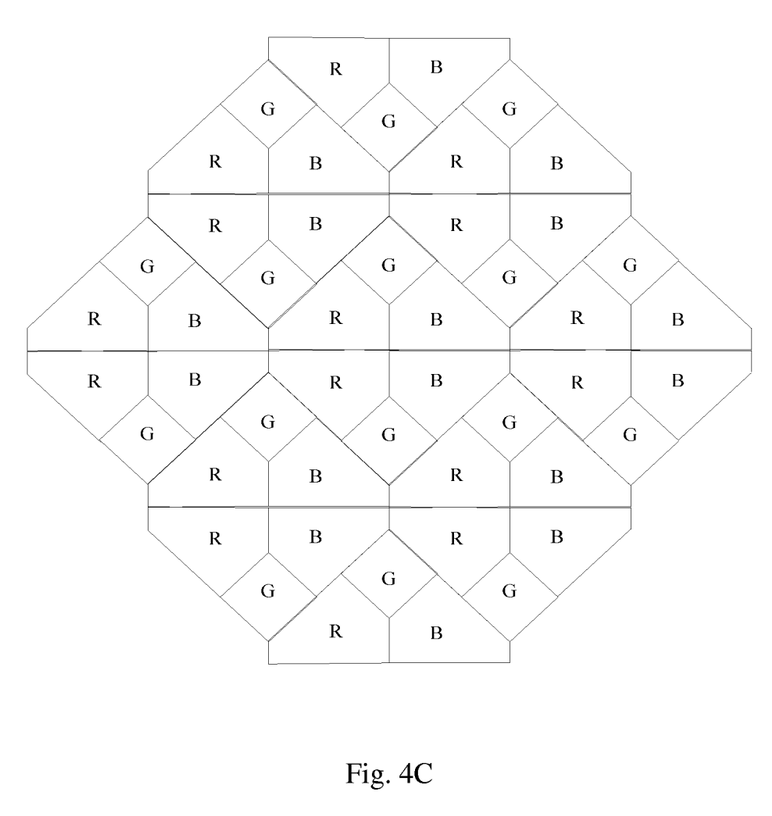
FIG. 4C is a schematic view of the pixel structure according to the third embodiment of the present disclosure.

FIG. 4C illustrates a pixel array composed of the pixel units as illustrated in FIG. 4A. In this pixel array, adjoining edges of at least one sub-pixel included in each pixel unit are totally or partially adjoined to adjoining edges of at least four sub-pixels with colors different from the color of the at least one sub-pixel. As a result, the light mixing effectiveness of the respective sub-pixels in the pixel array is improved, thereby further improving the image quality on the display screen.

In the third embodiment, tip structures having low luminous efficiency of the red sub-pixel R and the blue sub-pixel B are removed, so that the luminous efficiency of the pixel unit is improved. Since the luminous efficiency of the blue sub-pixel B is low, the luminous flux attenuation of the red sub-pixel R is severe and the human eyes are more sensitive to the green sub-pixel G, thus, in consideration of the effect of correcting the color shift, the ratio of the area of the green sub-pixel G, the area of the red sub-pixel R and the area of the blue sub-pixel B is set to 1:1.4:1.4 in the third embodiment.

The present disclosure further provides a display apparatus including the above pixel structure. Alternatively, the display apparatus may be an OLED display apparatus.

The above is only optional embodiments of the present disclosure, it should be noted that several improvements and modifications may be made for a person skilled in the art without departing from the principle of the present disclosure, and also should be considered to fall within the protection scope of the present disclosure.

What is claimed is:

1. A pixel structure in a display apparatus comprising a plurality of pixel units, each of the pixel units comprising:
   a first sub-pixel with a first color, having a first adjoining edge of a first length and a second adjoining edge of a second length;
   a second sub-pixel with a second color, having a first adjoining edge of the first length and a second adjoining edge of a third length; and
   a third sub-pixel with a third color, having a first adjoining edge of the second length and a second adjoining edge of the third length;
   wherein, in each of the pixel units, the first adjoining edge of the first sub-pixel is arranged to be adjoined to the first adjoining edge of the second sub-pixel, the second adjoining edge of the first sub-pixel is arranged to be adjoined to the first adjoining edge of the third sub-pixel, and the second adjoining edge of the second sub-pixel is arranged to be adjoined to the second adjoining edge of the third sub-pixel;
   wherein the first sub-pixel has a square shape; and the pixel unit has a square shape;
   each of the second sub-pixel and the third sub-pixel has a right-angled trapezoid shape; a size of the second sub-pixel is equal to a size of the third sub-pixel;
   the first adjoining edge of the second sub-pixel is an upper base of the second sub-pixel, and the second adjoining edge of the second sub-pixel is a hypotenuse of the second sub-pixel;
   the first adjoining edge of the third sub-pixel is an upper base of the third sub-pixel, and the second adjoining edge of the third sub-pixel is a hypotenuse of the third sub-pixel; and
   a ratio of the area of the first sub-pixel, the area of the second sub-pixel and the area of the third sub-pixel is 1:1.5:1.5.

2. The pixel structure according to claim 1, wherein adjoining edges of at least one sub-pixel included in each pixel unit are partially or totally adjoined to adjoining edges of at least four sub-pixels with colors different from the color of the at least one sub-pixel.

3. The pixel structure according to claim 1, wherein the first sub-pixel is a green sub-pixel, the second sub-pixel is a red sub-pixel, and the third sub-pixel is a blue sub-pixel; and
   an area of the first sub-pixel is less than either of an area of the second sub-pixel and an area of the third sub-pixel.

4. The pixel structure according to claim 3, wherein a ratio of the area of the second sub-pixel and the area of the first sub-pixel is 1.4 to 1.6; and a ratio of the area of the third sub-pixel and the area of the first sub-pixel is 1.4 to 1.6.

5. A display apparatus comprising the pixel structure according to claim 1.

6. A pixel structure comprising a plurality of pixel units, each of the pixel units comprising:
   a first sub-pixel with a first color, having a first adjoining edge of a first length and a second adjoining edge of a second length;
   a second sub-pixel with a second color, having a first adjoining edge of the first length and a second adjoining edge of a third length; and
   a third sub-pixel with a third color, having a first adjoining edge of the second length and a second adjoining edge of the third length;
   wherein, in each of the pixel units, the first adjoining edge of the first sub-pixel is arranged to be adjoined to the first adjoining edge of the second sub-pixel, the second adjoining edge of the first sub-pixel is arranged to be adjoined to the first adjoining edge of the third sub-pixel, and the second adjoining edge of the second sub-pixel is arranged to be adjoined to the second adjoining edge of the third sub-pixel;

wherein the first sub-pixel is a green sub-pixel, the second sub-pixel is a red sub-pixel, and the third sub-pixel is a blue sub-pixel; and an area of the first sub-pixel is less than either of an area of the second sub-pixel and an area of the third sub-pixel;

wherein the first sub-pixel has a square shape; each of the second sub-pixel and the third sub-pixel is of a pentagon with three right angles; and a size of the second sub-pixel is equal to a size of the third sub-pixel;

a first edge of the second sub-pixel is the first adjoining edge of the second sub-pixel, a second edge of the second sub-pixel is the second adjoining edge of the second sub-pixel, a first end of the first edge is connected to a first end of the second edge, an intersection angle between the first edge and the second edge is 135°; a first end of a third edge of the second sub-pixel is connected to a second end of the second edge, an intersection angle between the third edge and the second edge is 135°; a first end of a fourth edge of the second sub-pixel is connected to a second end of the first edge, and a length of the fourth edge is equal to a length of the first edge;

a first edge of the third sub-pixel is the first adjoining edge of the third sub-pixel, a second edge of the third sub-pixel is the second adjoining edge of the third sub-pixel, a first end of the first edge is connected to a first end of the second edge, an intersection angle between the first edge and the second edge is 135°; a first end of a third edge of the third sub-pixel is connected to a second end of the second edge, an intersection angle between the third edge and the second edge is 135°; a first end of a fourth edge of the third sub-pixel is connected to a second end of the first edge, and a length of the fourth edge is equal to a length of the first edge.

7. The pixel structure according to claim 6, wherein a ratio of the area of the first sub-pixel, the area of the second sub-pixel and the area of the third sub-pixel is 1:1.4:1.4.

8. A pixel structure comprising a plurality of pixel units, each of the pixel units comprising:

a first sub-pixel with a first color, having a first adjoining edge of a first length and a second adjoining edge of a second length;

a second sub-pixel with a second color, having a first adjoining edge of the first length and a second adjoining edge of a third length; and a third sub-pixel with a third color, having a first adjoining edge of the second length and a second adjoining edge of the third length;

wherein, in each of the pixel units, the first adjoining edge of the first sub-pixel is arranged to be adjoined to the first adjoining edge of the second sub-pixel, the second adjoining edge of the first sub-pixel is arranged to be adjoined to the first adjoining edge of the third sub-pixel, and the second adjoining edge of the second sub-pixel is arranged to be adjoined to the second adjoining edge of the third sub-pixel;

wherein the first sub-pixel has a square shape; each of the second sub-pixel and the third sub-pixel is of a pentagon with three right angles; and a size of the second sub-pixel is equal to a size of the third sub-pixel;

a first edge of the second sub-pixel is the first adjoining edge of the second sub-pixel, a second edge of the second sub-pixel is the second adjoining edge of the second sub-pixel, a first end of the first edge is connected to a first end of the second edge, an intersection angle between the first edge and the second edge is 135°; a first end of a third edge of the second sub-pixel is connected to a second end of the second edge, an intersection angle between the third edge and the second edge is 135°; a first end of a fourth edge of the second sub-pixel is connected to a second end of the first edge, and a length of the fourth edge is equal to a length of the first edge;

a first edge of the third sub-pixel is the first adjoining edge of the third sub-pixel, a second edge of the third sub-pixel is the second adjoining edge of the third sub-pixel, a first end of the first edge is connected to a first end of the second edge, an intersection angle between the first edge and the second edge is 135°; a first end of a third edge of the third sub-pixel is connected to a second end of the second edge, an intersection angle between the third edge and the second edge is 135°; a first end of a fourth edge of the third sub-pixel is connected to a second end of the first edge, and a length of the fourth edge is equal to a length of the first edge.

9. The pixel structure according to claim 8, wherein a ratio of the area of the first sub-pixel, the area of the second sub-pixel and the area of the third sub-pixel is 1:1.4:1.4.

* * * * *